United States Patent
Lee et al.

(10) Patent No.: US 9,349,726 B2
(45) Date of Patent: May 24, 2016

(54) SEMICONDUCTOR DEVICE FABRICATION METHOD AND STRUCTURE

(71) Applicant: Taiwan Semiconductor Manufacturing Company, Ltd., Hsin-Chu (TW)

(72) Inventors: Chia-Ching Lee, New Taipei (TW); Hsueh Wen Tsau, Zhunan (TW); Mrunal A. Khaderbad, Hsin-Chu (TW); Da-Yuan Lee, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/226,616

(22) Filed: Mar. 26, 2014

(65) Prior Publication Data

US 2015/0279837 A1      Oct. 1, 2015

(51) Int. Cl.
*H01L 27/088* (2006.01)
*H01L 21/28* (2006.01)
*H01L 21/8234* (2006.01)

(52) U.S. Cl.
CPC ........ *H01L 27/088* (2013.01); *H01L 21/28008* (2013.01); *H01L 21/82345* (2013.01)

(58) Field of Classification Search
None
See application file for complete search history.

(56) References Cited

U.S. PATENT DOCUMENTS

| | | | |
|---|---|---|---|
| 5,698,879 A * | 12/1997 | Aritome | H01L 27/115 257/315 |
| 6,068,818 A * | 5/2000 | Ackley et al. | 422/50 |
| 6,660,588 B1 * | 12/2003 | Yang | H01L 21/28273 257/E21.209 |
| 2003/0045080 A1 * | 3/2003 | Visokay et al. | 438/591 |
| 2004/0106261 A1 * | 6/2004 | Huotari | H01L 21/28088 438/287 |
| 2005/0082573 A1 * | 4/2005 | Williford | H01L 21/26586 257/202 |
| 2005/0116286 A1 * | 6/2005 | Schuler | H01L 27/11524 257/338 |
| 2008/0067606 A1 * | 3/2008 | Jung et al. | 257/369 |
| 2008/0096338 A1 * | 4/2008 | Zhang et al. | 438/197 |
| 2010/0301427 A1 * | 12/2010 | Lenski et al. | 257/392 |

* cited by examiner

*Primary Examiner* — Bilkis Jahan
*Assistant Examiner* — Kevin Quinto
(74) *Attorney, Agent, or Firm* — Slater Matsil, LLP

(57) ABSTRACT

A semiconductor device, and a method of fabrication, is introduced. In an embodiment, a dummy gate stack is formed on a substrate. Lightly-doped source/drain regions and highly-doped source/drain regions are formed in the substrate on either sides of the dummy gate stack. An inter-layer dielectric (ILD) layer is formed over the substrate. Subsequently, the dummy gate stack is removed and a gate stack is formed in an opening in the ILD layer. The gate stack is formed by forming an interfacial layer in the opening of the ILD layer, forming a gate dielectric layer over the interfacial layer, forming a work function metal layer over the gate dielectric layer, and forming one or more gate electrode layers over the work function metal layer. Contacts are formed in the ILD layer and one or more metallization layers are formed over the ILD layer.

20 Claims, 7 Drawing Sheets

SEMICONDUCTOR DEVICE FABRICATION METHOD AND STRUCTURE

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
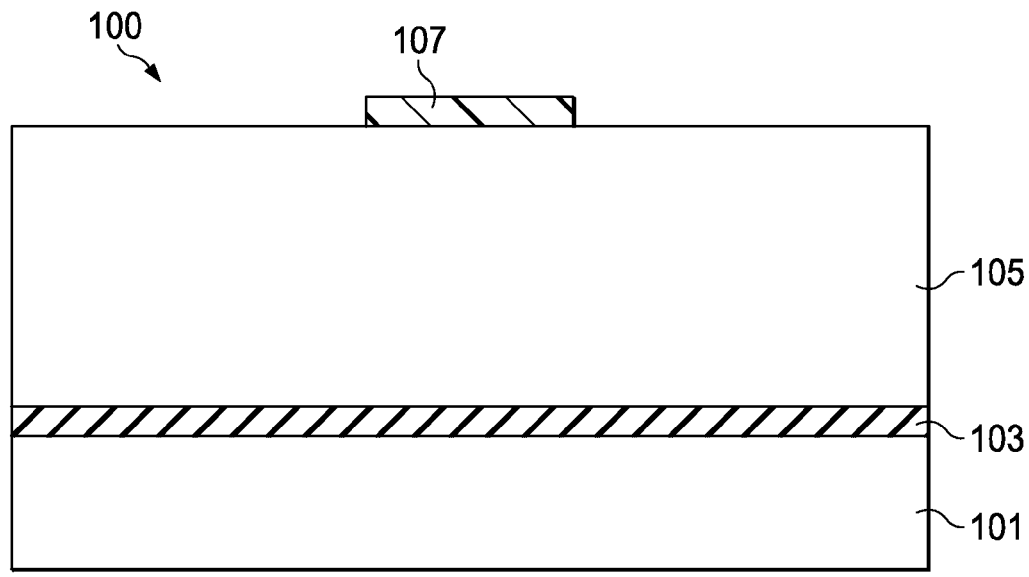
FIGS. 1-11 are cross-sectional views illustrating various intermediate stages of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method for forming metal-oxide-semiconductor field effect transistor (MOSFET) devices is provided. In particular, a method for forming an planar MOSFET will be described in greater detail below. However, persons skilled in the art will recognize that similar methods may be also applied to MOSFETS with non-planar structures, such as fin MOSFETs.

FIGS. 1-8 illustrate various intermediate stages of forming a semiconductor device 100 in accordance with some embodiments. Referring first to FIG. 1, there is shown a substrate 101, a first sacrificial layer 103 over the substrate 101, a second sacrificial layer 105 over the first sacrificial layer 103, and a patterned photoresist layer 107 over the second sacrificial layer 105. As will be described in greater detail below, the first sacrificial layer 103 and the second sacrificial layer 105 will be patterned to form a dummy gate stack in a gate-last process.

In further reference to FIG. 1, the substrate 101 may comprise, for example, bulk silicon, doped or undoped, or an active layer of a semiconductor-on-insulator (SOI) substrate. Generally, an SOI substrate comprises a layer of a semiconductor material, such as silicon, silicon germanium, silicon carbide, or the like, formed on an insulator layer. The insulator layer may be, for example, a buried oxide (BOX) layer or a silicon oxide layer. The insulator layer is provided on a substrate, typically a silicon substrate or glass substrate. Other substrates, such as multi-layered or gradient substrates may also be used.

The first sacrificial layer 103 may comprise one or more layers of, for example, silicon oxide, silicon nitride (SiN), silicon oxynitride (SiON), tetraethyl orthosilicate (TEOS), or the like. The first sacrificial layer 103 may be formed using any suitable method, chemical vapor deposition (CVD), and plasma-enhanced CVD (PECVD), or the like. In some embodiments, the second sacrificial layer 105 may comprise a suitable conductive material, such as polysilicon and may be formed using any suitable method, such as CVD, PECVD, or the like.

In further reference to FIG. 1, photolithography techniques may be used to pattern the second sacrificial layer 105 to form a dummy gate stack, as will be described in greater detail below. The patterned photoresist layer 107 is formed over the second sacrificial layer 105 to aid in the subsequent patterning process of the second sacrificial layer 105. Generally, a photoresist material is deposited over the second sacrificial layer 105 and then exposed to radiation such as ultraviolet light or an excimer laser through a reticle (not shown), in accordance with a desired pattern. A bake or cure operation may be performed, and a developer may be used to remove either the exposed or unexposed portions of the photoresist material, depending on whether a positive or negative resist is utilized. Thus, the patterned photoresist layer 107 that is used to form a dummy gate stack is formed over the second sacrificial layer 105. The specific pattern of the patterned photoresist layer 107, as described herein, is for illustrative purposes only, and other patterns may be formed depending on the design of the semiconductor device 100.

Figure 2:
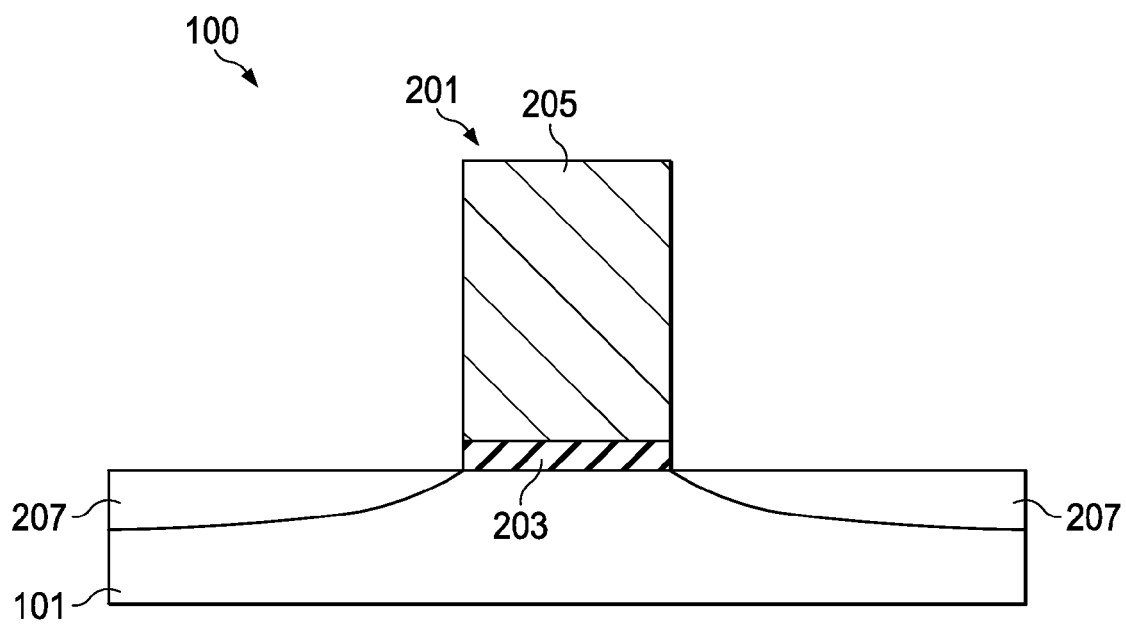

In reference to FIG. 2, the second sacrificial layer 105 and the first sacrificial layer 103 are etched, for example, by an anisotropic dry etch process or an anisotropic wet etch process to remove exposed portions of the second sacrificial layer 105 and form a dummy gate stack 201 over the substrate 101. In an embodiment, the dummy gate stack 201 comprises a dummy gate dielectric 203 and a dummy gate electrode 205, with the dummy gate dielectric 203 comprising a remaining portion of the first sacrificial layer 103, and the dummy gate electrode comprising a remaining portion of the second sacrificial layer 105. Subsequently, the photoresist layer is removed using, for example, an ashing process in combination with a wet clean process. In some embodiments, the anisotropic wet etch may be performed on the first sacrificial layer 103 comprising silicon oxide and the second sacrificial layer comprising polysilicon using potassium hydroxide (KOH), ethylenediamine pyrocatechol (EDP), tetramethylammonium hydroxide (TMAH), or similar. The anisotropic dry etch process may include physical dry etching, chemical dry etching, reactive ion etching, or similar. In an embodiment, the ions that are used in chemical dry etching of silicon are tetrafluoromethane ($CF_4$), sulfur hexafluoride ($SF_6$), nitrogen trifluoride ($NF_3$), chlorine gas ($Cl_2$), or fluorine ($F_2$). The typical reactive ion etching gasses for silicon are $CF_4$, $SF_6$ and $BCl_2+Cl_2$.

In further reference to FIG. 2, as discussed in greater detail below, the dummy gate stack 201 is a sacrificial structure used to align and form source/drain regions adjacent to the dummy gate stack 201 and will be replaced in subsequent processing steps. As such, the dummy gate stack 201 may be formed of any suitable material and processes. In some embodiments, the dummy gate stack 201 may be formed simultaneously as other devices on the substrate 101, such as other transistors.

Lightly-doped source/drain (LDD) regions 207 are formed by implanting dopants, e.g., N-type dopants or P-type dopants, using the dummy gate stack 201 as a mask, thereby aligning the LDD regions 207 with the edges of dummy gate stack 201. Halo and/or pocket regions (not shown) may also be formed. In some embodiments, the substrate 101 may be a P-doped substrate, and phosphorus, arsenic or other suitable dopants may be used to form the LDD regions 207. In other embodiments, the substrate 101 may be an N-doped substrate, and boron or other suitable dopants may be used to form the LDD regions 207.

Figure 3:
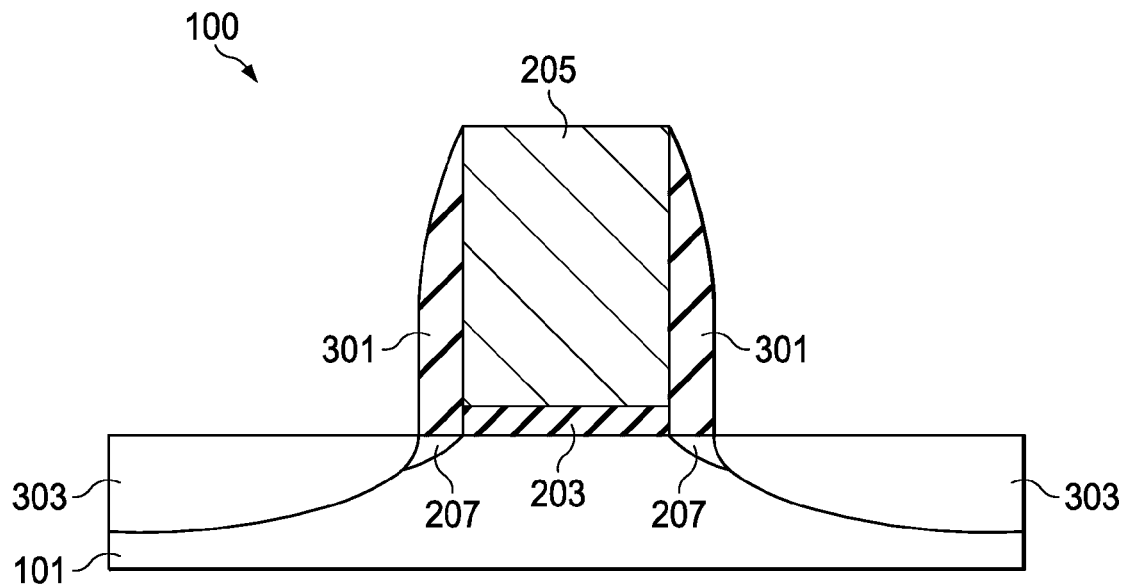

FIG. 3 further illustrates the formation of spacers 301 along sidewalls of the dummy gate stack 201. In some embodiments, the spacers 301 are formed by forming one or more layers of a dielectric material and performing an anisotripic etch to remove the dielectric material other than that adjacent the dummy gate stack 201. The spacers may comprise of silicon oxide, silicon nitride (SiN), silicon oxynitride (SiON), tetraethyl orthosilicate (TEOS), or the like. For example, in some embodiments, the spacers 301 are formed by patterning a spacer layer (not shown) comprising a silicon oxide layer (not shown) and an overlying silicon nitride layer (not shown). The patterning may be performed by either wet etching or dry etching to remove horizontal portions of the spacer layer.

In further reference to FIG. 3, highly-doped source/drain regions 303 are formed by implanting dopants, e.g., N-type dopants or P-type dopants, using the dummy gate stack 201 and the spacers 301 as a mask, thereby aligning the highly-doped source/drain regions 303 with the edges of spacers 301. In some embodiments, the substrate 101 may be a P-doped substrate, and phosphorus, arsenic or other suitable dopants may be used to form the highly-doped source/drain regions 303. In other embodiments, the substrate 101 may be an N-doped substrate, and boron or other suitable dopants may be used to form the highly-doped source/drain regions 303.

The structure provided above is for illustrative purposes only and other embodiments may utilize other structures and features. For example, some embodiments may incorporate buried stressors, recessed source/drain regions filled with a stressor, raised source/drain regions, different materials, different gate structure and materials, halo implants, different source/drain doping profiles, and the like.

Figure 4:
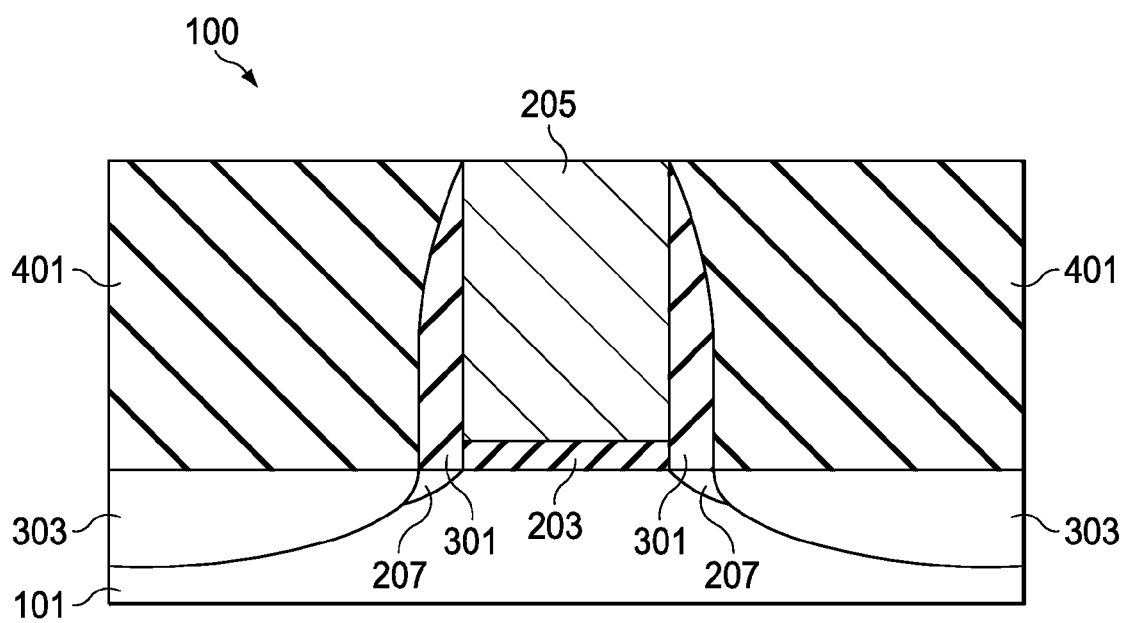

Referring to FIG. 4, an inter-layer dielectric (ILD) layer 401 is formed in accordance with some embodiments. The ILD layer 401 may be formed, for example, of a low-K dielectric material, such as phosphosilicate glass (PSG), borophosphosilicate glass (BPSG), fluorinated silicate glass (FSG), SiOxCy, Spin-On-Glass, Spin-On-Polymers, silicon carbon material, compounds thereof, composites thereof, combinations thereof, or the like, by any suitable method, such as spinning, chemical vapor deposition (CVD), and plasma-enhanced CVD (PECVD). The ILD layer 401 may comprise a plurality of dielectric layers.

Referring further to FIG. 4, the ILD layer 401 over the dummy gate stack 201 is removed, exposing the dummy gate stack 201. In some embodiments, a chemical mechanical polishing (CMP) process is used to planarize an upper surface of the ILD layer 401 level with an upper surface of the dummy gate stack 401 as illustrated in FIG. 4.

Figure 5:
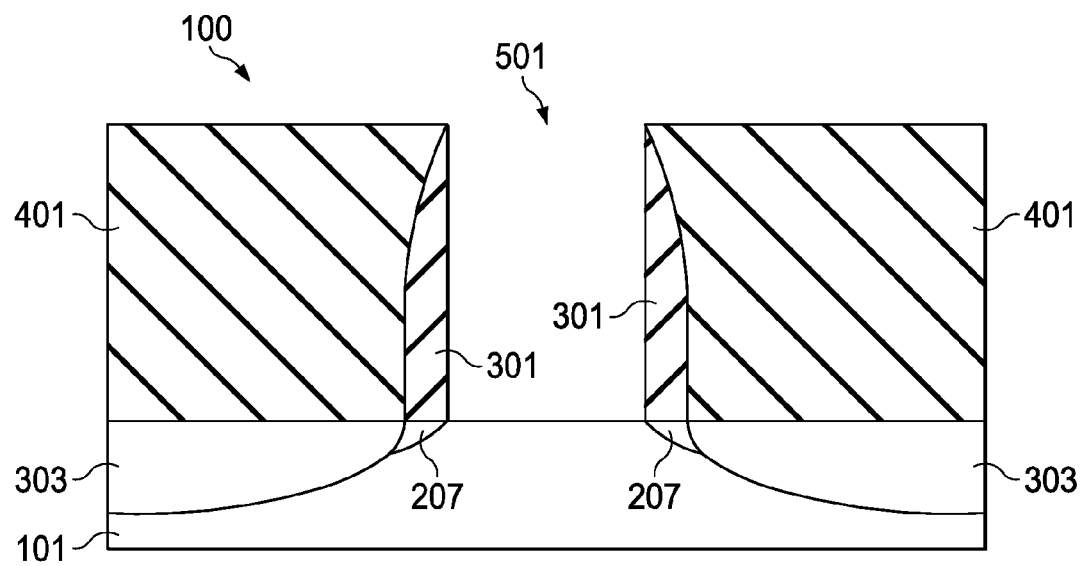

FIG. 5 illustrates the selective removal of the dummy gate stack 201, thereby forming an opening 501, in accordance with some embodiments. In embodiments in which the dummy gate electrode 205 comprises a polysilicon material, the dummy gate electrode 205 may be selectively etched using either dry or wet etching. In the case dry etching is used, the process gas may include $CF_4$, $CHF_3$, $NF_3$, $SF_6$, $Br_2$, HBr, $Cl_2$, or combinations thereof. Diluting gases such as $N_2$, $O_2$, or Ar may optionally be used. In the case wet etching is used, the chemicals may include $NH_4OH:H_2O_2:H_2O$ (APM), $NH_2OH$, KOH, $HNO_3:NH_4F:H_2O$, and/or the like. In embodiments in which the dummy gate dielectric 203 comprises a silicon oxide layer, the silicon oxide layer may be removed using a wet etch process using a dilute hydrofluoric acid.

Subsequently, an interfacial layer (not shown) may be formed along a surface of the substrate 101 in the opening 501 in accordance with some embodiments. The interfacial layer helps to buffer the substrate 101 and a subsequently formed high-k dielectric layer. In some embodiments, the interfacial layer is a chemical silicon oxide, which may be formed of chemical reactions. For example, a chemical oxide may be formed using deionized water+ozone ($DI+O_3$), $NH_4OH+H_2O_2+H_2O$ (APM), or other methods. Other embodiments may utilize a different material or processes for the interfacial layer. In an embodiment, the interfacial layer may have a thickness between about 0.5 nm and about 5 nm.

Figure 6:
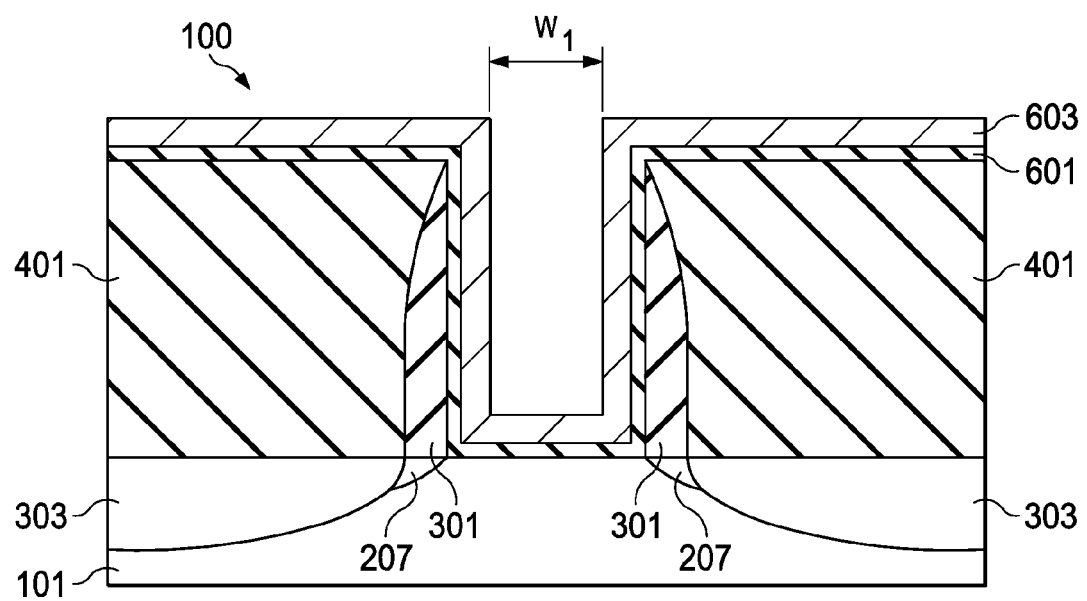

Referring to FIG. 6, a gate dielectric layer 601 is formed on the interfacial layer in the opening 501. In an embodiment, the gate dielectric layer 601 may comprise one or more high-k dielectric layers (e.g., having a dielectric constant greater than 3.9), or other suitable dielectric material. For example, the one or more gate dielectric layers may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, and combinations thereof. Exemplary materials include $MgO_x$, $BaTi_xO_y$, $BaSr_xTi_yO_z$, $PbTi_xO_y$, $PbZr_xTi_yO_z$, and the like. The formation methods of the gate dielectric layer 601 may comprise molecular-beam deposition (MBD), atomic layer deposition (ALD), physical vapor deposition (PVD), and the like. In an embodiment, the gate dielectric layer 601 may have a thickness between about 0.5 nm and about 5 nm.

In further reference to FIG. 6, a work function metal layer 603 is formed on the gate dielectric layer 601 in accordance with some embodiments. The work function metal layer 603 may be used to adjust a work function of a subsequently formed gate electrode to exhibit the work function suitable to the type of device being formed, e.g., a PMOSFET device or an NMOSFET device. In some embodiments, it may be desirable to adjust the work function of the gate electrode to the band-edge of the silicon; that is, for an NMOS device, adjusting the work function close to the conduction band, and for a PMOS device, adjusting the work function close to the valence band. In some embodiments, multiple layers may be used to adjust the work function and other operating characteristics of the semiconductor device 100. The work function metal layer 603 may comprise, for example, Ti, Ag, Al, TiAl, TiAlN, TiAlC, TaC, TaCN, TaSiN, TaAlC, Mn, Zr, or the like for an NMOSFET device, and TiN, WN, TaN, Ru, Co or the like for a PMOSFET device. In an embodiment, the work function metal layer 603 may have a thickness between about 2 nm and about 20 nm. After forming the gate dielectric layer 601 and the work function metal layer 603 in the opening 501, a width of the opening 501 is reduced to a first width $W_1$. In some embodiment, the first width $W_1$ may be between about 0 μm and about 100 μm.

As discussed in greater detail below, a gate electrode layer is formed in the opening 501. Depending on a value of the first width $W_1$, the gate electrode layer may comprise either one or multiple layers. In some embodiments, a gate electrode of a MOSFET device with a short channel may comprise a single layer. In other embodiments, a gate electrode of a MOSFET device with a long channel may comprise two layers distinct from each other.

Figure 7:
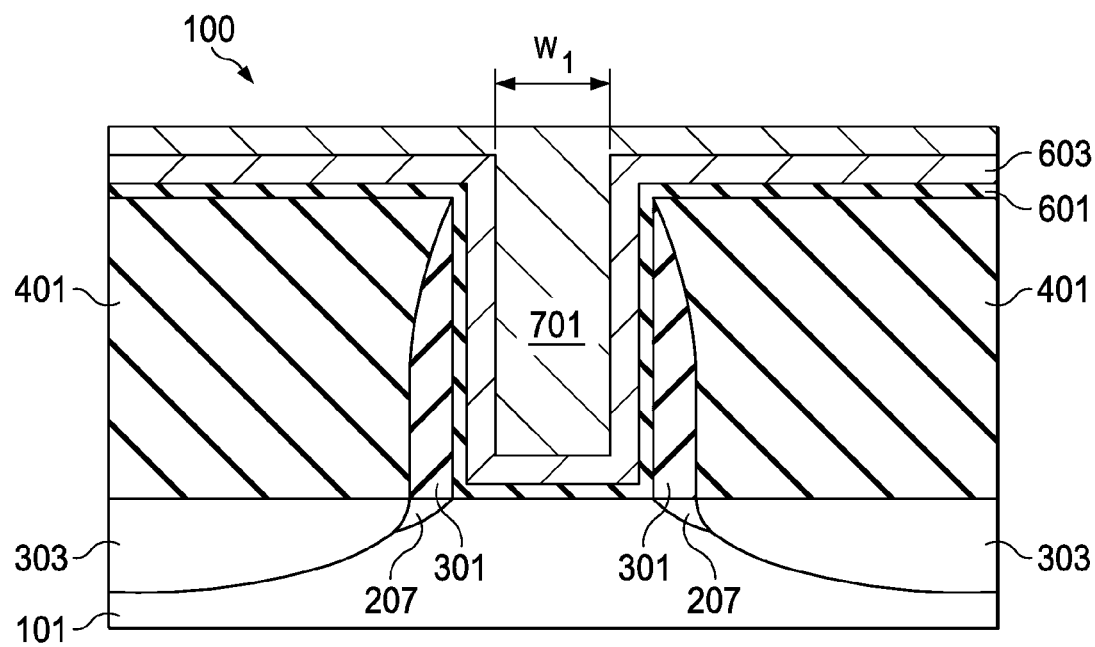

FIG. 7 illustrates formation of a gate electrode layer 701 in the opening 501 in accordance with an embodiment with the opening 501 having the first width $W_1$ less than about 100 nm. In some embodiments, the opening 501 may be filled with a conductive material to form the gate electrode layer 701. The gate electrode layer 701 may comprise Ti, Co, W alloys, Al alloys, Cu alloys, or the like. The formation methods of the gate electrode layer 701 may comprise ALD, PVD, CVD, metal-organic chemical vapor deposition (MOCVD), and the like.

Figure 8:
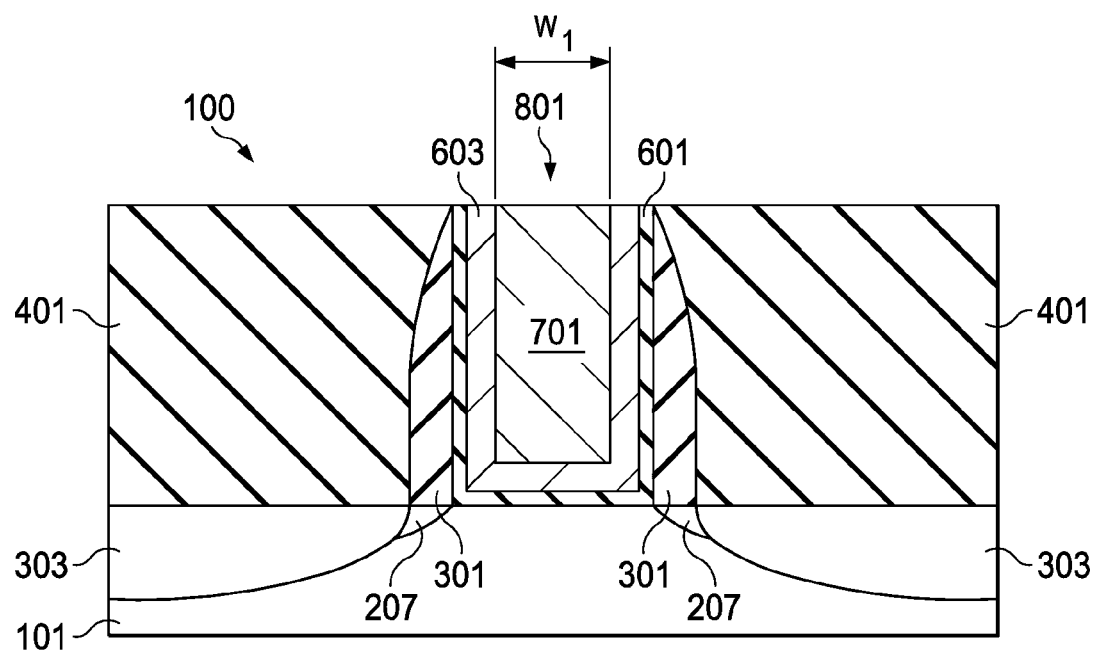

Referring to FIG. 8, excess materials of the interfacial layer, the gate dielectric layer 601, and the gate electrode layer 701 may be removed using, for example, a CMP process to form a gate stack 801. In an embodiment, the gate stack 801 comprises the interfacial layer, the gate dielectric layer 601, the work function metal layer 603, and the gate electrode layer 701.

Figure 9:
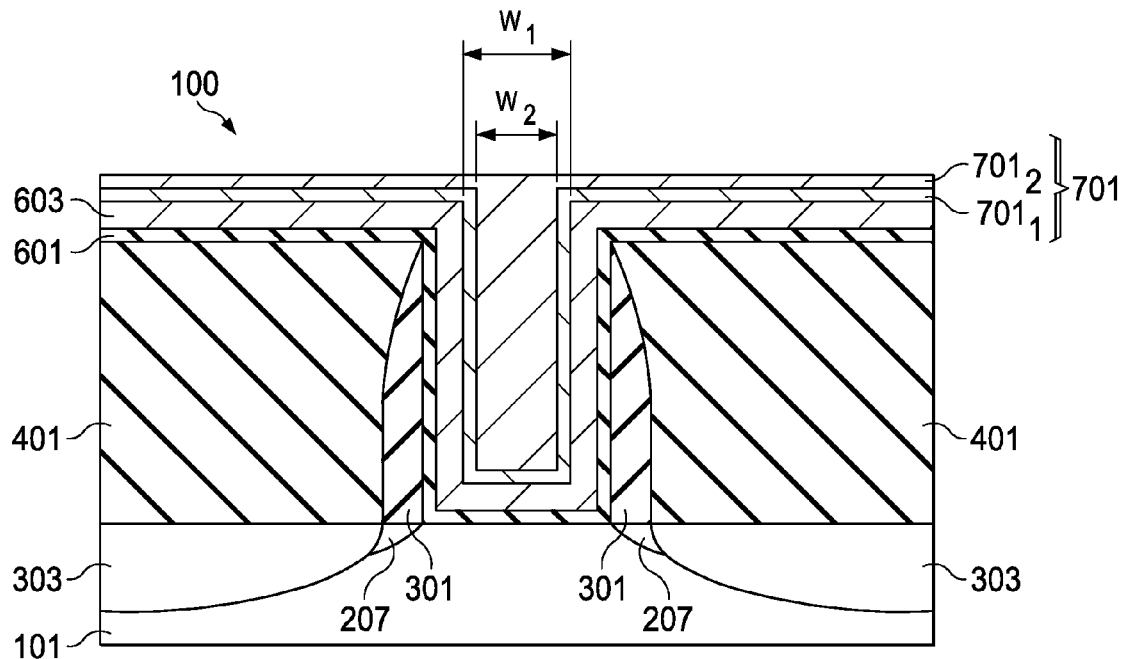

Referring to FIG. 9, the gate electrode layer 701 may comprise a first gate electrode sublayer $701_1$ and a second gate electrode sublayer $701_2$ in accordance with an embodiment with the opening 501 having the first width $W_1$ more than about 4 nm. In some embodiments, the opening 501 may be filled with multiple conductive materials. For example, FIG. 9 illustrates an embodiment in which the opening 501 is filled a first conductive material to form the first gate electrode sublayer $701_1$, and a second conductive material to form the second gate electrode sublayer $701_2$. The first gate electrode sublayer $701_1$ may comprise Ti, Co, W alloys, Al alloys, Cu alloys, or the like, and the second gate electrode sublayer $701_2$ may comprise Al, Al alloys, Co, W, W alloys, Cu, Cu alloys, or the like. The formation methods of a first gate electrode sublayer $701_1$ and the second gate electrode sublayer $701_2$ may comprise ALD, PVD, CVD, metal-organic chemical vapor deposition (MOCVD), and the like. In some embodiments, the first gate electrode sublayer $701_1$ and the second gate electrode sublayer $701_2$ may comprise different materials. For example, the first gate electrode sublayer $701_1$ may comprise Ti and the second gate electrode sublayer $701_2$ may comprise Cu. In other embodiments, the first gate electrode sublayer $701_1$ and the second gate electrode sublayer $701_2$ may comprise a same material, but deposited using different methods. For example, the first gate electrode sublayer $701_1$ and the second gate electrode sublayer $701_2$ may comprise Cu, and the first gate electrode sublayer $701_1$ may be formed using ALD, and the second gate electrode sublayer $701_2$ may be formed using CVD, or PVD. Even though the first gate electrode sublayer $701_1$ and the second gate electrode sublayer $701_2$ may be formed by filling the opening 501 with a same material, the first gate electrode sublayer $701_1$ and the second gate electrode sublayer $701_2$ may have different compositions due to the different deposition methods. For example, the first gate electrode sublayer $701_1$ formed by depositing cobalt (Co) using a CVD method may comprise Co and impurities of carbon (C) and oxygen (O), and the second gate electrode sublayer $701_2$ formed by Co using a PVD method may comprise Co and O impurities, and may not comprise substantial amount of C impurities. In other embodiments, different filling processes may induce, for example, different crystal structures, impurity concentrations and impurity types between the first gate electrode sublayer $701_1$ and the second gate electrode sublayer $701_2$.

Figure 10:
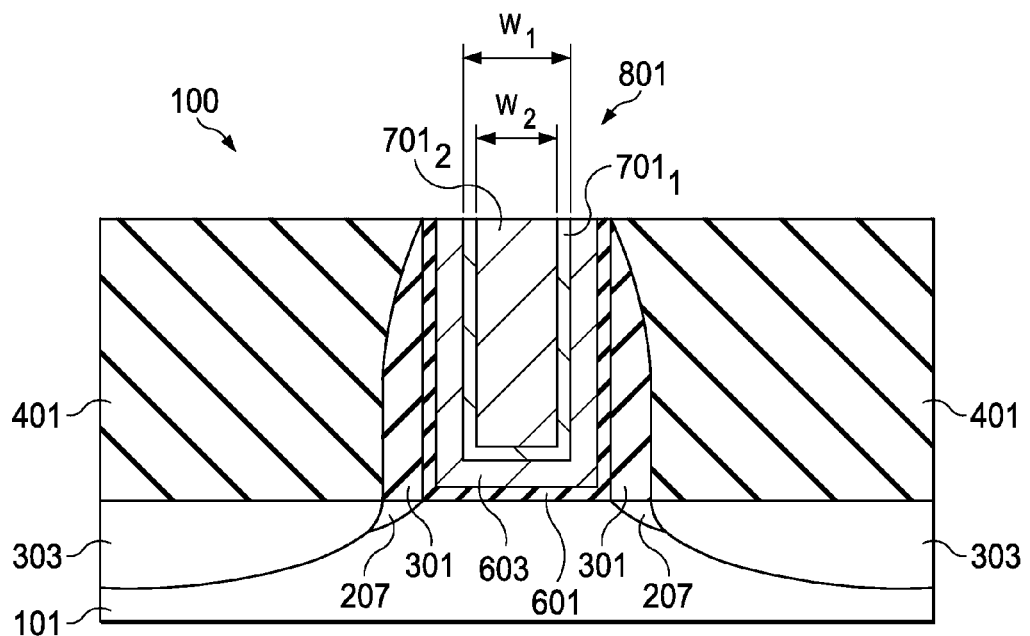

Referring to FIG. 10, excess materials of the interfacial layer, the gate dielectric layer 601, the first gate electrode sublayer $701_1$, and the second gate electrode sublayer $701_2$ may be removed using, for example, a CMP process to form the gate stack 801. In an embodiment, the gate stack 801 comprises the interfacial layer, the gate dielectric layer 601, the work function metal layer 603, the first gate electrode sublayer $701_1$ and the second gate electrode sublayer $701_2$.

Figure 11:
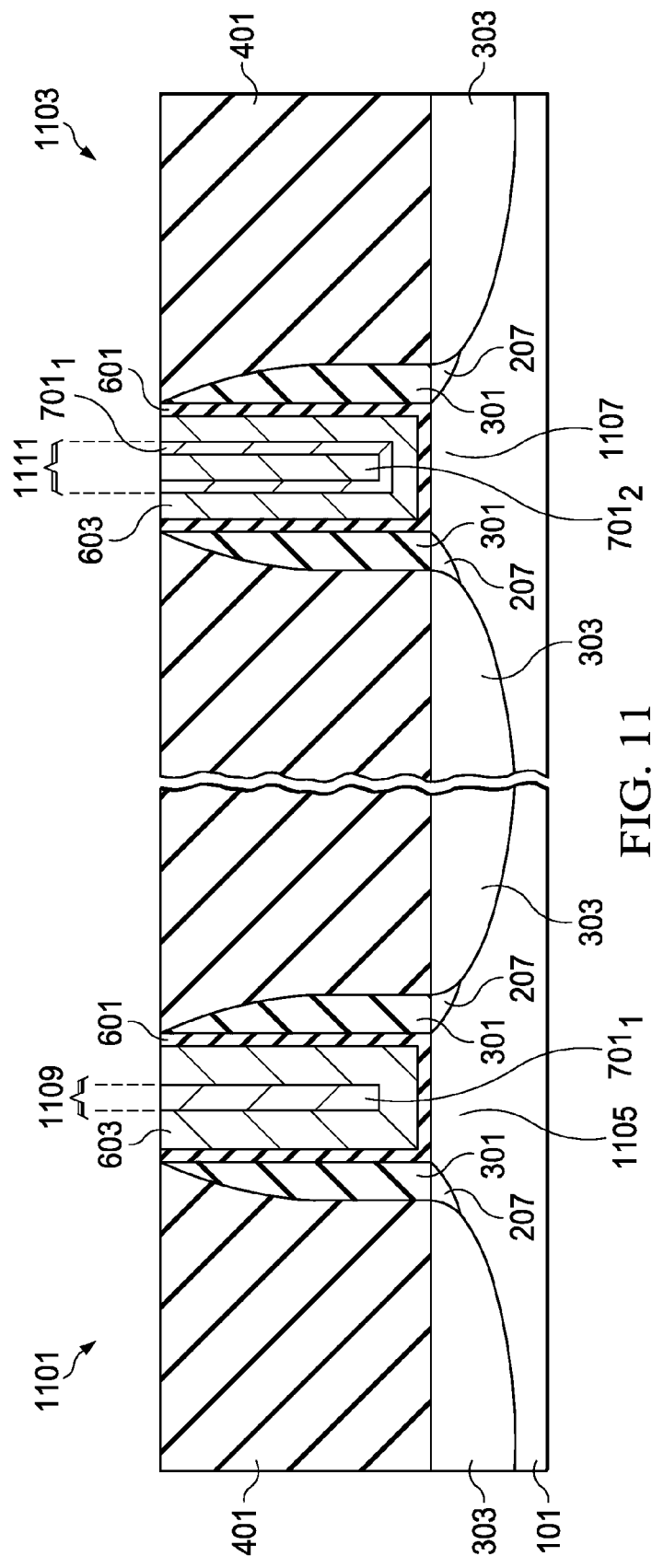

The above described method for forming a gate electrode layer may help manufacturers to maintain a high wafers per hour (WPH) output rate in their facilities while not sacrificing the quality of the gate electrode layer. In some embodiments, multiple MOSFET devices with different channel lengths may be formed on the substrate 101 as illustrated in FIG. 11. For example, a first MOSFET 1101 device may have a short channel 1105, and a second MOSFET device 1103 may have a long channel 1107. In some embodiments, the first MOSFET device 1101 may be similar to the semiconductor device 100 illustrated in FIG. 8, with similar numerical references labeling similar features, and the description is not repeated herein. In some embodiments, the second MOSFET device 1103 may be similar to the semiconductor device 100 illustrated in FIG. 10, with similar numerical references labeling similar features, and the description is not repeated herein. In some embodiments, a first gate electrode layer 1109 of the first MOSFET device 1101 and a second gate electrode layer 1111 of the second MOSFET device 1103 may be formed using the dual fill method described above. For example, the first gate electrode layer 1109 and the second gate electrode layer 1111 may be formed by depositing a first conductive material $701_1$ using a first deposition method, and a second conductive material $701_2$ using a second deposition method. The first deposition methods may have a moderate deposition rate to provide good step coverage for the first MOSFET device 1101 with the short channel 1105. The first deposition method may be sufficient to form the first gate electrode layer 1109 of the first MOSFET device 1101. However, the first deposition method with the moderate deposition rate may not be sufficient to fully form the second gate electrode layer 1111 of the second MOSFET device 1103 with the long channel 1107. To fully form the second gate electrode layer 1111 of the second MOSFET device 1103, the second conductive material $701_2$ may be deposited using the second deposition method. The second conductive material $701_2$ is deposited on top of the first conductive material $701_1$ and excess conductive materials are subsequently removed, for example, using a CMP method. Since the first gate electrode layer 1109 is fully formed by the first deposition method, the second conductive material $701_2$ may not contribute to a structure of the first gate electrode layer 1109. In some embodiments, the first gate electrode layer 1109 may comprise the first conductive material $701_1$, and the second gate electrode layer 1111 may comprise the first conductive material $701_1$ and the second conductive material $701_2$.

Referring further to FIGS. 7 and 8, in an embodiment with the opening 501 having the first width $W_1$ less than about 4 nm, the opening 501 is fully filled with a single layer of a conductive material to form the gate electrode layer 701.

Referring further to FIGS. 9 and 10, in an embodiment with the opening 501 having the first width $W_1$ more than about 100 nm, the opening 501 is fully filled with multiple layers of a conductive material. For example, the opening 501 is filled with a first layer of a first conductive material using a first deposition method to form the first gate electrode sublayer $701_1$, and a second layer of a second conductive material using a second deposition method to form the second gate electrode sublayer $701_2$. In some embodiments, the first conductive material may be similar to the second conductive material while the first deposition method may be different from the second deposition method. In other embodiments, the first conductive material may be different from the second conductive material while the first deposition method may be similar to the second deposition method.

Further manufacturing steps may be performed on the semiconductor device 100. Contacts (not shown) may be formed in the ILD layer 401 to provide electrical contacts between the highly-doped source/drain regions 303, the gate stack 703 and subsequently formed metallization layers. In some embodiments, the contacts may be formed using, for example, a damascene process, a dual damascene process, or similar. The ILD layer 401 may be patterned using photolithography techniques to form trenches and vias. The contacts are formed by depositing a suitable material in the trenches and the vias of the ILD layer 401 using various deposition and plating methods, or similar. In addition, the contacts may include one or more barrier/adhesion layers (not shown) to protect the ILD layer 401 from diffusion and metallic poisoning. The barrier layer may comprise titanium, titanium nitride, tantalum, tantalum nitride, or other alternatives. The barrier layer may be formed using PVD, CVD, or the like. The material of the contacts may comprise copper, a copper alloy, silver, gold, tungsten, tantalum, aluminum, and the like. In an embodiment, the steps for forming the barrier layer and the contacts may include blanket forming barrier layer, depositing a thin seed layer of a conductive material, and filling the trenches and the vias in the ILD layer 401 with the conductive material, for example, by plating. A CMP is then performed to remove excess barrier layer and conductive material.

Subsequently, metallization layers (not shown) may be formed on top of the ILD layer 401. The metallization layers may comprise one or multiple interconnect structures separated by one or more inter-metal dielectric (IMD) layers. In some embodiments, the interconnect structures may be formed in the IMD layers using, for example, a damascene process, a dual damascene process, or similar. The IMD layer may be patterned using photolithography techniques to form trenches and vias. The interconnect structures are formed by depositing a suitable material in the trenches and the vias of the IMD layer using various deposition and plating methods, or similar. In addition, the interconnect structures may include one or more barrier/adhesion layers (not shown) to protect the IMD layer from diffusion and metallic poisoning. The IMD layer may comprise dielectric materials and be formed using methods similar to the ILD layer 401. The barrier layer may comprise titanium, titanium nitride, tantalum, tantalum nitride, or other alternatives. The barrier layer may be formed using PVD, CVD, or the like. The material of the contacts may comprise copper, a copper alloy, silver, gold, tungsten, tantalum, aluminum, and the like. In an embodiment, the steps for forming the barrier layer and the contacts may include blanket forming barrier layer, depositing a thin seed layer of a conductive material, and filling the trenches and the vias in the IMD layer with the conductive material, for example, by plating. A CMP is then performed to remove excess barrier layer and conductive material. In some embodiments, the interconnect structures may provide electrical connections between different devices formed on the substrate 101.

Figure 12:
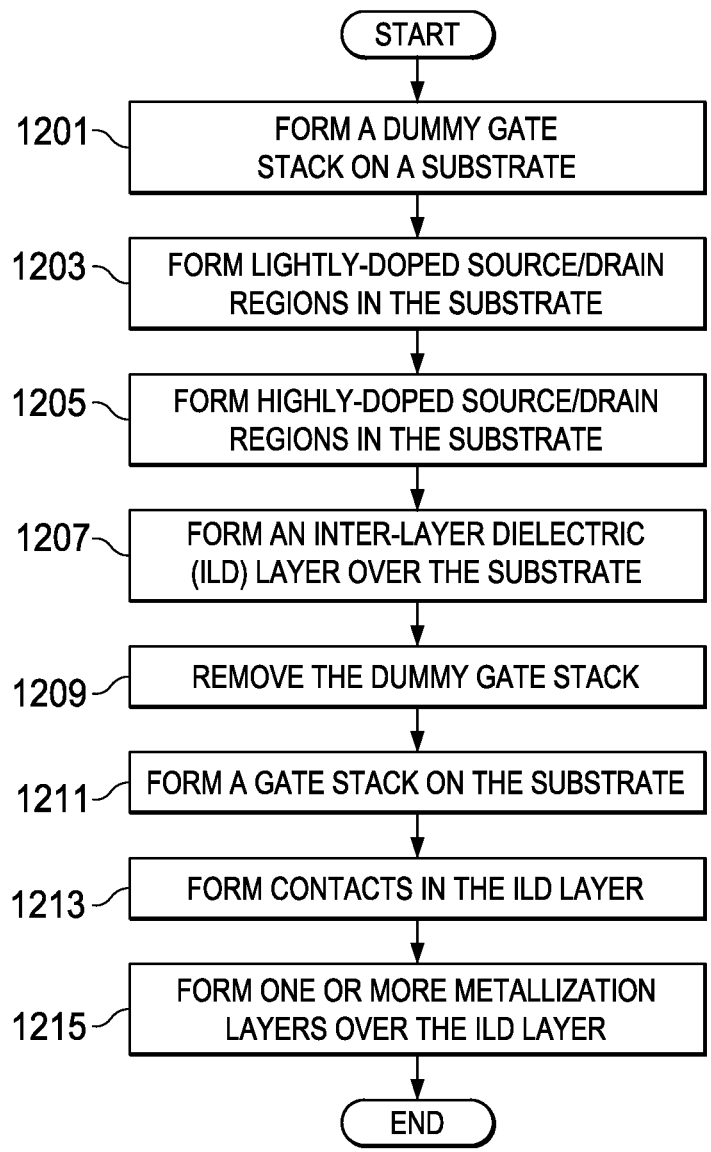
FIG. 12 is a flowchart illustrating a semiconductor device fabrication method in accordance with some embodiments.

FIG. 12 is a flowchart illustrating a method that may be performed to manufacture a semiconductor device in accordance with an embodiment. The method begins at step 1201, wherein a dummy gate stack is formed on a substrate, such as that discussed above with reference to FIGS. 1 and 2. In step 1203, lightly-doped source/drain regions are formed in the substrate on either sides of the dummy gate stack as discussed above with reference to FIG. 2. In step 1205, spacers are formed along sidewalls of the dummy gate stack, and highly-doped source/drain regions in the substrate as discussed above with reference to FIG. 3. An inter-layer dielectric (ILD) layer is formed in step 1207 as discussed above with reference to FIG. 4. Subsequently, in step 1209, the dummy gate stack is removed and an opening is formed in the ILD layer as discussed above with reference to FIG. 5.

In step 1211, a gate stack is formed in the opening of the IDL layer as discussed above with reference to FIGS. 6-10. The gate stack is formed by forming an interfacial layer in the opening of the ILD layer, forming a gate dielectric layer over the interfacial layer, forming a work function metal layer over the gate dielectric layer, and forming one or more gate electrode layers over the work function metal layer as discussed above with reference to FIGS. 6-10. In step 1213, contacts are formed in the ILD layer to provide electric contacts between the highly-doped source/drain regions, gate stacks and subsequently formed metallization layers as described above. Finally, in the step 1215, one or more metallization layers are formed over the ILD layer. The metallization layers may comprise one or more inter-metal dielectric (IMD) layers, with one or more interconnect structures embedded in the IMD layers to provide electrical contacts between different semiconductor devices on the substrate.

In the above embodiments, a method for forming a planar MOSFET is described. However, persons skilled in the art will recognize that similar methods may be also applied to other embodiments. For example, a fin MOSFET device may be formed using the method as described with reference to FIGS. 1-12. In some embodiments, the substrate 101 of FIGS. 1-11 may represent a fin of a fin MOSFET.

In an embodiment, a semiconductor device comprises a substrate and a first transistor on the substrate. The first transistor comprises a first channel, the first channel having a first length, and a first gate, the first gate having a first number of conductive layers. The semiconductor device further comprises a second transistor on the substrate. The second transistor comprises a second channel, the second channel having a second length, and a second gate, the second gate having a second number of conductive layers, the second number being larger than the first number.

In another embodiment, a semiconductor device comprises a substrate and a first transistor on the substrate. The first transistor comprises a first gate of a first length, the first gate having a first conductive layer comprising a first conductive material of a first composition. The semiconductor device further comprises a second transistor on the substrate. The second transistor comprises a second gate of a second length, the second gate having a second conductive layer comprising the first conductive material of the first composition and a third conductive layer of a second conductive material.

In yet another embodiment, a method of fabricating a semiconductor device, the method comprises providing a substrate and forming a first gate of a first transistor on the substrate, the first gate having a first number of conductive layers over a first dielectric layer. The method further comprises forming a second gate of a second transistor on the substrate, the second gate having a second number of conductive layers over a second dielectric layer, the second number being larger than the first number.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a first transistor on the substrate, the first transistor comprising:
      a first channel, the first channel having a first length; and
      a first gate, the first gate having a first number of conductive layers, a topmost conductive layer of the first number of conductive layers comprising a first conductive material; and
   a second transistor on the substrate, the second transistor comprising:
      a second channel, the second channel having a second length; and
      a second gate, the second gate having a second number of conductive layers, the second number being larger than the first number, a conductive layer below a topmost conductive layer of the second number of conductive layers comprising the first conductive material, the second number of conductive layers being in electrical contact with each other.

2. The semiconductor device of claim 1, wherein the second length is larger than the first length.

3. The semiconductor device of claim 1, wherein the topmost conductive layer of the first number of conductive layers comprises the first conductive material with a first type of impurities, and the topmost conductive layer of the second number of conductive layers comprises the first conductive material with a second type of impurities.

4. The semiconductor device of claim 1, wherein the topmost conductive layer of the second number of conductive layers comprises a second conductive material, the first conductive material being different from the second conductive material.

5. The semiconductor device of claim 1, wherein the topmost conductive layer of the first number of conductive layers has a width less than about 100 nm.

6. The semiconductor device of claim 1, wherein a bottommost conductive layer of the first number of conductive layers and a bottommost conductive layer of the second number of conductive layers comprise a work function material.

7. The semiconductor device of claim 1, wherein the topmost conductive layer of the second number of conductive layers has a width less than the second length.

8. A semiconductor device comprising:
   a substrate;
   a first transistor on the substrate, the first transistor comprising a first gate of a first length, the first gate having a first conductive layer comprising a first conductive material of a first composition; and
   a second transistor on the substrate, the second transistor comprising a second gate of a second length, the second gate having a second conductive layer comprising the first conductive material of the first composition and a third conductive layer of a second conductive material, wherein the second conductive material is the first conductive material of a second composition, the first composition being different from the second composition.

9. The semiconductor device of claim 8, wherein the second length is larger than the first length.

10. The semiconductor device of claim 8, wherein the first gate comprises a fourth conductive layer of a work function material and the second gate comprises a fifth conductive layer of the work function material.

11. The semiconductor device of claim 8, wherein the third conductive layer has a width less than the second length.

12. The semiconductor device of claim 8, wherein the first conductive layer is a topmost conductive layer of the first gate, and wherein the third conductive layer is a topmost conductive layer of the second gate.

13. The semiconductor device of claim 8, wherein the second conductive layer contacts a sidewall of the third conductive layer.

14. A method of fabricating a semiconductor device, the method comprising:
   forming a first gate of a first transistor on a substrate, the first gate having a first number of conductive layers over a first dielectric layer; and
   forming a second gate of a second transistor on the substrate, the second gate having a second number of conductive layers over a second dielectric layer, the second number being larger than the first number, wherein the forming the first gate of the first transistor and the forming the second gate of the second transistor comprises:
      forming a third dielectric layer having a first opening and a second opening;
      forming a first conductive layer of a first material using a first method over the third dielectric layer and in the first and second openings, the first conductive layer completely filling the first opening;
      forming a second conductive layer of a second material using a second method over the first conductive layer in the second opening; and
      removing the first conductive layer and the second conductive layer from over the third dielectric layer, thereby forming the first gate and the second gate in the first opening and the second opening, respectively.

15. The method of claim 14, wherein the first gate is formed to a first length and the second gate is formed to a second length, the second length being larger than the first length.

16. The method of claim 14, further comprising forming a first work function metal layer interposed between the first conductive layer and the first dielectric layer and forming a second work function metal layer interposed between the first conductive layer and the second dielectric layer.

17. The method of claim 14, wherein the first material is the same as the second material with a different composition.

18. The method of claim 14, wherein the first material is different from the second material.

19. The method of claim 14, wherein the first dielectric layer is interposed between the third dielectric layer and the first conductive layer, and wherein the second dielectric layer is interposed between the third dielectric layer and the second conductive layer.

20. The method of claim 14, wherein the forming the first gate of the first transistor and the forming the second gate of the second transistor further comprises:

forming the first dielectric layer in the first opening; and
    forming the second dielectric layer in the second opening.

\* \* \* \* \*